(12) United States Patent
Matsuzaki et al.

(10) Patent No.: US 10,974,335 B2
(45) Date of Patent: Apr. 13, 2021

(54) COMPOSITE SOLDERING, DE-SOLDERING STATION LOAD DETECTION

(71) Applicant: Hakko Corporation, Osaka (JP)

(72) Inventors: Kenji Matsuzaki, Osaka (JP); Hitoshi Takeuchi, Osaka (JP); Kenta Nakamura, Osaka (JP)

(73) Assignee: Hakko Corporation, Osaka (JP)

( * ) Notice: Subject to any disclaimer, the term of this patent is extended or adjusted under 35 U.S.C. 154(b) by 301 days.

(21) Appl. No.: 16/031,242

(22) Filed: Jul. 10, 2018

(65) Prior Publication Data

US 2020/0016674 A1   Jan. 16, 2020

(51) Int. Cl.
| | | |
|---|---|---|
| *B23K 3/03* | (2006.01) | |
| *G01R 19/165* | (2006.01) | |
| *G01K 1/02* | (2021.01) | |
| *H05K 13/08* | (2006.01) | |
| *B23K 3/08* | (2006.01) | |

(52) U.S. Cl.
CPC ................ *B23K 3/033* (2013.01); *G01K 1/02* (2013.01); *G01R 19/1659* (2013.01); *B23K 3/08* (2013.01); *H05K 13/0885* (2018.08)

(58) Field of Classification Search
None
See application file for complete search history.

(56) References Cited

U.S. PATENT DOCUMENTS

| | | | | |
|---|---|---|---|---|
| 5,223,689 A | * | 6/1993 | Cowell | B23K 1/00 219/85.22 |
| 5,495,093 A | * | 2/1996 | Griffith | B23K 3/033 219/233 |
| 10,688,578 B2 | * | 6/2020 | Nguyen | G01B 21/085 |
| 2002/0008086 A1 | * | 1/2002 | Fujii | B23K 31/125 219/110 |
| 2003/0089696 A1 | * | 5/2003 | Yokoyama | B23K 3/03 219/240 |
| 2015/0246404 A1 | * | 9/2015 | Teraoka | B23K 3/08 219/129 |
| 2016/0031044 A1 | * | 2/2016 | Marino | H05K 3/225 228/102 |
| 2016/0096232 A1 | * | 4/2016 | Marino | B23K 3/03 228/9 |
| 2017/0173719 A1 | * | 6/2017 | Nguyen | B23K 31/125 |
| 2019/0047066 A1 | * | 2/2019 | Matsuzaki | B23K 3/0478 |
| 2020/0130085 A1 | * | 4/2020 | Miyazaki | B23K 3/08 |

FOREIGN PATENT DOCUMENTS

| | | | | | |
|---|---|---|---|---|---|
| EP | 0403260 A2 | * | 12/1990 | | B23K 3/033 |
| JP | 61037368 A | * | 2/1986 | | B23K 3/033 |
| JP | 6517412 B1 | * | 5/2019 | | B23K 3/03 |

* cited by examiner

*Primary Examiner* — Joseph M. Pelham
(74) *Attorney, Agent, or Firm* — David B. Abel

(57) ABSTRACT

A soldering and de-soldering station and systems including enhanced features for the soldering heating tools and load detection functionality.

18 Claims, 6 Drawing Sheets

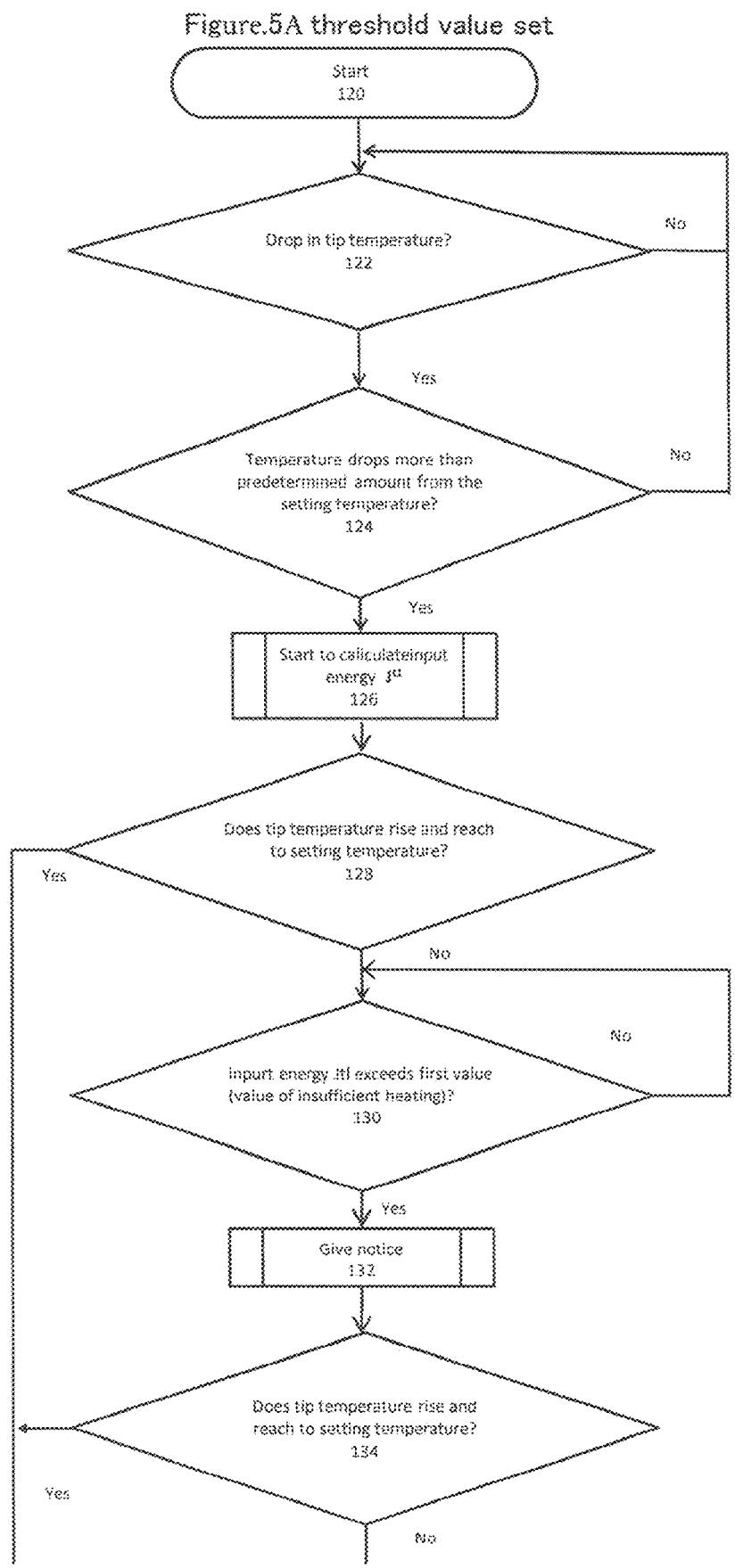

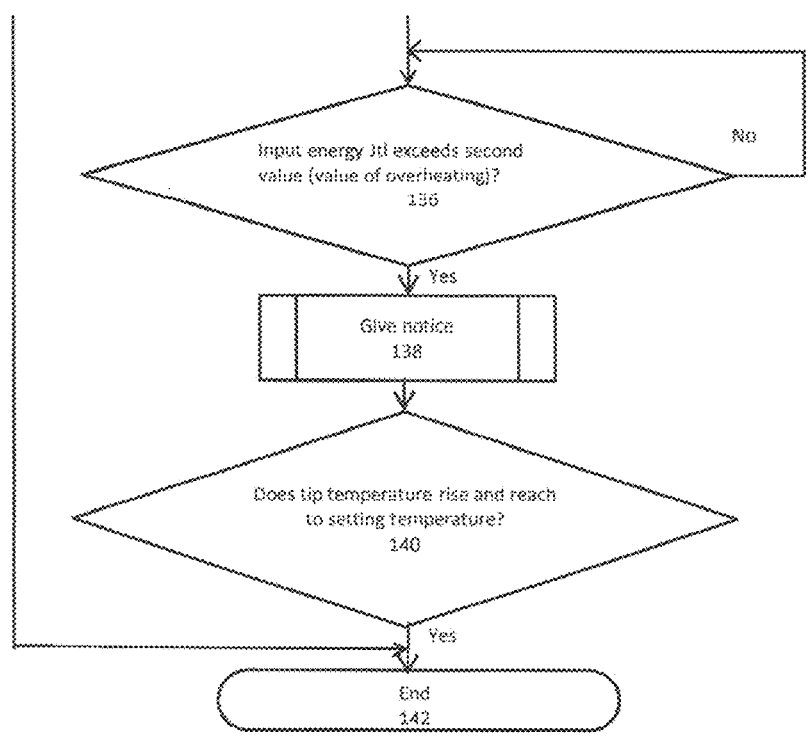
Figure 5B threshold value set

COMPOSITE SOLDERING, DE-SOLDERING STATION LOAD DETECTION

BACKGROUND OF THE INVENTION

In the electronics industry the task of soldering electronic components is often a manual operation. The soldering function is performed by setting the work area on a work bench. The worker will operate the soldering device facing the work area. The soldering devices may include soldering irons, de-soldering irons, and tweezers but they are not limited thereto. The individual soldering device is connected to a power supply control device. The power supply control device controls the heat generation of the soldering device mainly by adjusting the power applied to the soldering device. Conventional power supply control devices include a power supply portion supplying power to the soldering device, a power supply control portion controlling the power output from the power supply portion, a temperature setting portion for inputting a set temperature which is the control target of the power supply control section, a display for displaying the setting information of the temperature setting portion, and a housing for housing or enclosing the circuitry. The worker or operator operates the temperature setting portion while viewing the information displayed on the display. This operation includes a process to update or set the setting information to the temperature setting portion. The setting information is information related to conditions for determining the set temperature of the soldering device as well as the physical characteristics of the work to be soldered. In industrial applications, the same set of soldering functions may be carried out by the operator, and the supervisors may impose conditions on the soldering operations to promote efficiency and uniformity. For example, the supervisor may set a maximum operating temperature for the power supply control device to prevent overheating of the work during the soldering operations.

BRIEF SUMMARY OF THE INVENTION

The present invention is directed to the components of an interchangeable multi-component system including a control station, heating tools comprising a handle and cartridges, associated sensor equipment and components, and components allowing interconnectability to a host or server via an intranet or interne. The control station includes enhanced features for interacting with and controlling the soldering heating tools including load detection functionality.

BRIEF DESCRIPTION OF THE FIGURES

FIGS. 5A and 5B depict a program logic diagram for the software for the load cycle energy level function.

DETAILED DESCRIPTION OF THE INVENTION

Figure 1:
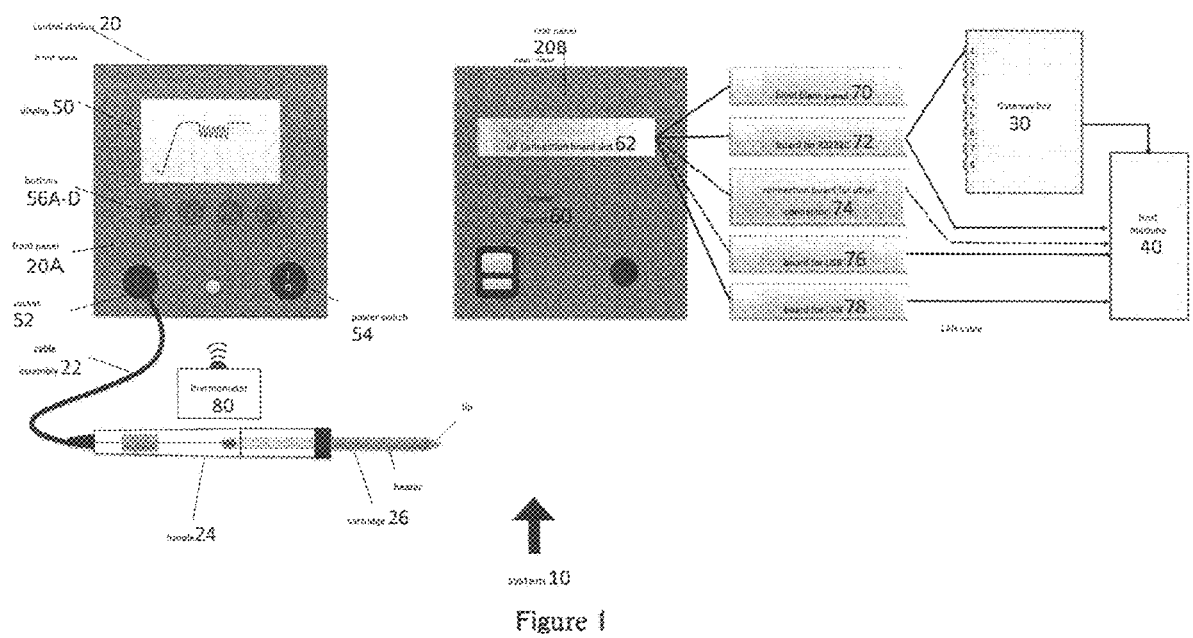
FIG. 1 provides a block and schematic depiction of the system of the present invention.

FIG. 1 provides a block and schematic depiction of the system 10 of the present invention. The system 10 is configured around a control station 20, which is connected via a cable assembly 22 to a handle 24 and cartridge 26. In FIG. 1, the cartridge 26 is depicted as being a soldering cartridge, however it should be appreciated that the cartridge 26 is removable and replaceable with a number of different types of cartridge thermal tools for soldering and de-soldering operations. The cartridge comprises a heater with an integrated sensor contained within a soldering tip. The control station 20 provides control signals and power to the cartridge 26, which an operator uses to carry out the soldering or de-soldering operations. The control station 20 is adapted to communicate with thermometer 80, as well as a gateway box 30 and a host machine 40. The host machine 40 may be a component of a protected intranet system, and it may alternatively be connected to the internet.

The control station 20 has a front panel 20A and a rear panel 20B, depicted side by side in FIG. 1. On the front panel 20A, the control station 20 has a display 50, for example a liquid crystal display (LCD), although other displays for example a light emitting diode (LED) display may be used. The front panel 20A also includes a socket 52 allowing connection to the cable assembly 22, and a power switch 54 for powering the control station 20 on and off. The front panel 20A also includes a number of control or data entry components, depicted as buttons 56A, 56B, 56C, and 56D. It may be appreciated that the data entry components may be any number of electrical components including for example toggle switches, knobs, dials, and touch or optical sensors.

The rear panel 20B of the control station 20 includes a power socket 60, a I/F connection board slot 62. FIG. 1 schematically depicts various items that may be affixed to the I/F connection board slot 62, including for example a blind blank panel 70, board for RS232C 72, connection board for other component 74, board for USB 76 and a LAN board 78. Each of these boards 72, 74, 76 and 78 may be used with appropriate cabling to connect the control station 20 to the gateway box 30 or the host machine 40. The board may be for any of an Ethernet, Ethernet for Control Automation Technology, Ethernet Industrial Protocol, Controller Area Network, Universal Asynchronous Receiver/Transmitter or I2C-Inter-Integrated Circuit, Serial Peripheral Interface. The system 10 contemplates a wired or wireless thermometer 80, that converts the respective data signals to data that may be used by the control station 20.

FIG. 1 also schematically depicts the handle 24 securing the cartridge 26. The handle 24 may include an indicator, for example a tone generator and the cartridge 26 may include a memory element 92, for example a PROM, EPROM or EEPROM. The memory element 92 may be used to store information specific to the type of cartridge that cannot be changed (fixed data) and it may store information that is written to the memory by or via the control station 20 (variable data). The fixed data may include for example a cartridge serial number, tip shape data, and factory set temperature data for each cartridge. The variable data may include programmed set temperature data, temperature offset values, applied load counts, totaled powered time, total solder operations, and any use with leaded solder. Applied load counts may account for non-solder operations (thus a number higher than total solder operations) or it could be a total on powered time.

Load Detection Function

The control station 20 preferably includes a load detection function for identifying and quantifying the thermal load on the cartridge during each soldering operation. By detecting the thermal load imposed when the components and substrate are being heated to the temperature at which the solder is liquefied, and the load required to liquefy the solder, and timing the duration of the load, each load cycle for each soldering operation can be measured, counted and monitored. By counting the load cycles associated with a specific cartridge, the cartridge life can be monitored. In addition, by measuring the load cycle, the solder load for each soldering activity may be recorded and used for traceability of the work, as discussed further below. Also, once the control station 20 has recorded a defined load cycle for a particular soldering activity, or alternatively when a user defines a load cycle range for a particular soldering activity, the control station 20 can provide an indication to the operator when the load cycle of a subsequent soldering operation is outside an acceptable range of the defined load cycle.

Operationally, the load detection function of the soldering station may identify the start of a load state by detecting a decrease of the temperature as sensed by the tip temperature sensor and thereafter the soldering station determines the end of the load state by detecting a rise in the output of the temperature measured by the tip temperature sensor. During the course of the soldering event, the number of load cycles included within the period from the start to the end of the load state may then be recorded by the soldering station and used to define an optimal load cycle.

By monitoring the number of counted load cycles for a particular cartridge, the life of a particular cartridge style can be generated and recorded by the soldering station to be used as a guide for similar cartridge styles, so that a user may be made aware when replacements should be ordered. In addition, by calculating the energy generated from the start to the end of the load state for a particular soldering operation and matching that calculation to the particular workpiece, the load cycle requirement may be recorded for traceability of the work.

In soldering operations, the size and shape of the soldering cartridge tip, the size and material of the work to be soldered, the type of solder being used, and the tip temperature all factor into a proper soldering event. Experienced users of the soldering system may calibrate a soldering station for a particular soldering operation using the soldering station described herein. For example, an experienced user can program the soldering station to define two load cycle energy levels for a particular soldering event.

To define the minimum load cycle energy level for a particular soldering event, the user initiates a soldering operation and stops the soldering process when the user determines that a solder joint has been obtained. While that soldering event is occurring, the station continuously calculates the energy requirement in Joules for the load state when the soldering task is being performed with a specific soldering object, solder type and set temperature. When the user concludes that an ideal soldering operation has been obtained, the user will program the soldering station to record the amount of energy required during the operation and sets that level as a minimum. The user can then set that energy level as a minimum or lower level for a soldering action, and program the control station to provide an indication that the lower level has been met, for example an audible single beep, so that the user does not end a subsequent soldering task before the lower level of energy input is satisfied.

The user then performs a second soldering operation with the same parameters (soldering object, solder type and set temperature), but for the second operation the user continues the soldering event until the user determines an appropriate upper limit for the energy for soldering. After that second operation, the user will program the soldering station to record the amount of energy required during the second operation and sets that level as a maximum or upper level. The user then instructs the control station provide an indication that the upper level has been met, for example by an audible double beep, chime or tone. Setting the upper limit helps avoid excessive heating in subsequent soldering events.

Based upon the respective minimum and maximum energy levels, the operator can set two definitions for subsequent users. Using the minimum as the lower limit value of the energy required for a proper soldering operation, the soldering station makes a comparison in every subsequent soldering event to determine if the energy required calculation is less than the minimum or lower limit value, the soldering station identifies to the user that a proper soldering event has not been accomplished. As the second definition, the maximum energy level is set as the upper limit value. In a subsequent soldering operation, if heating continues after the upper limit value is exceeded, the soldering station determines that the amount of energy required may have caused or is indicative of an overheating failure and the soldering station identifies to the user that the upper limit value has been exceeded.

By programing the soldering station to record and inform the user that the amount of energy required for a soldering operation is between the lower limit value and the upper limit value at the time of performing the specific soldering operation, the user is made aware of the appropriate levels of energy for soldering, and thereby the user may avoid inappropriate soldering, so that ideal solder joints can be reproduced. Similarly, since it is possible to know when the timing of the energy delivery has exceeded both the lower limit value and the upper limit value, inadequate soldering such as insufficient heating and overheating can be avoided.

Figure 2:
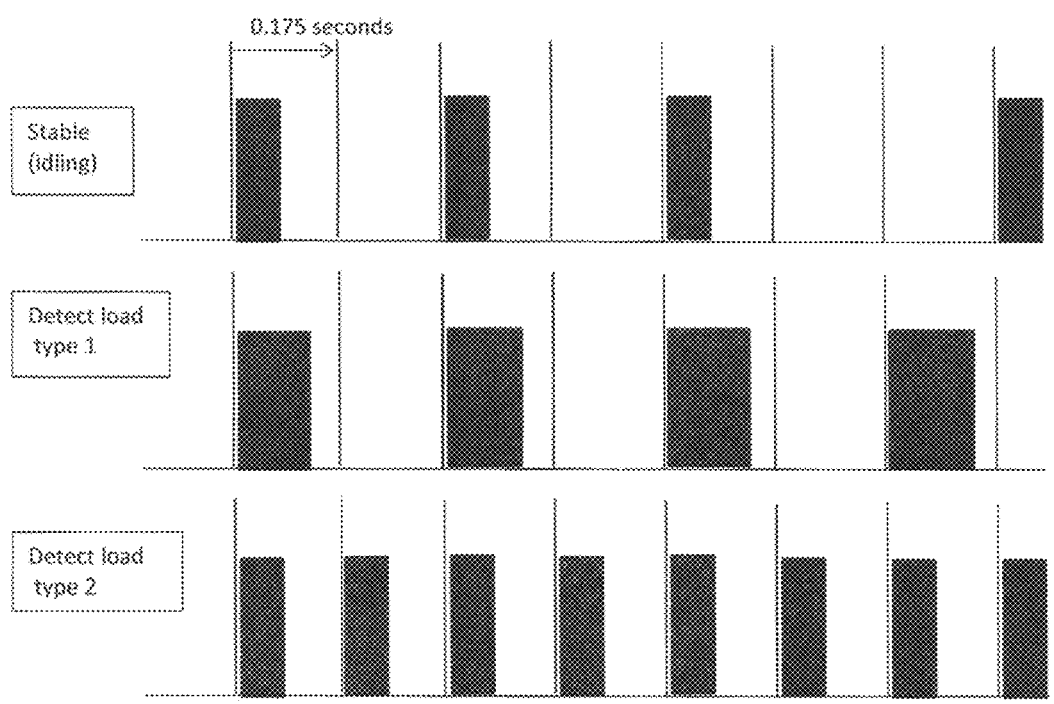
FIG. 2 schematically depicts the energizing or powering cycles of the cartridge.

FIG. 2 schematically depicts the energizing or powering cycles of the cartridge in time spaced blocks, depending on the use of soldering cartridge. As depicted in FIG. 2, the cartridge is powered at a 60 Hz cycle, and the load or amount energized is determined every 0.175 seconds, i.e. 21 pulses. The energized length will be varied depending on the cycle. For example, when the cartridge is powered at a 50 Hz cycle, the load or amount energized is determined every 0.21 seconds, i.e. 21 pulses. The amount of the energized load is determined depending on the difference of the set temperature point and the actual temperature as measured by a temperature sensor located in the cartridge tip. Normally when the temperature of the tip is idling at the set temperature point power level, the difference between the set temperature point temperature and the actual temperature measured by the temperature sensor is small, so the load amount as determined to be minimal. When a soldering operation is initiated, the load on the cartridge increases because heat is being transferred from the cartridge to the work and the control station 20 increases the power output to the cartridge. As the amount of energy delivered to energize the cartridge increases, or even if the amount stays the same but the frequency of the energization cycle increases, the system will determine that a soldering load is being applied. When the amount of energy delivered to energize the cartridges returns to close to the idling state, the control station 20 will judge that the soldering load has ended. The soldering load is not detected in only one cycle (0.175 seconds, 21 pulses) but it is determined based upon the total energy within the time period that the thermal load is applied.

The foregoing description of the load determination is provided as an exemplary of the method. The method of identification of the load may change or may need to be adapted to accommodate changes in the circuit components other elements, such as heater performance. However, detecting the load will preferably rely upon identifying the temperature difference of the set temperature and the actual tip temperature measured by a temperature sensor.

Figure 3:
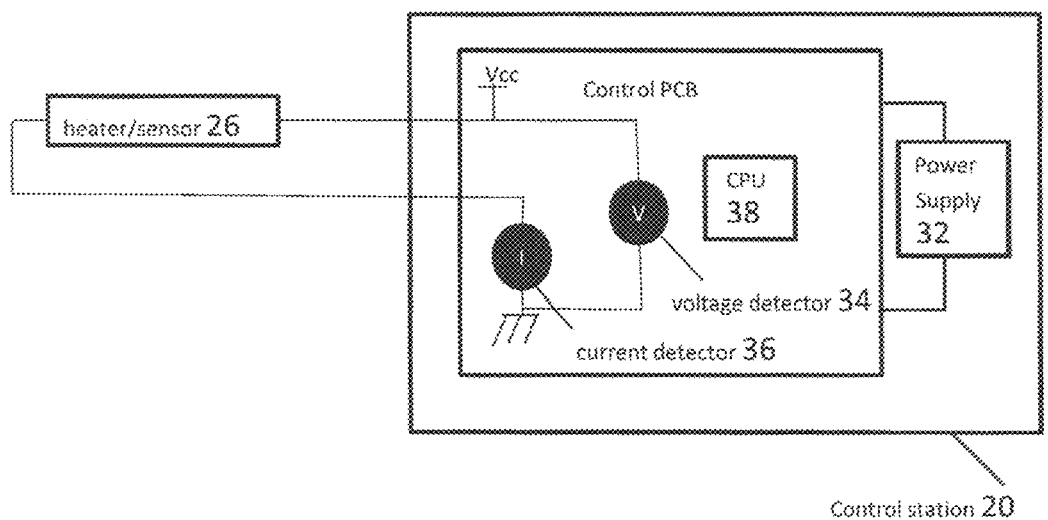
FIG. 3 is a simplified schematic of the load detection circuit.

FIG. 3 provides a simplified schematic of the load detection circuit. In this embodiment, the control station 20 includes a power supply 32, voltage detector 34, current detector 36, all controlled by a CPU 38. The control station 20 detects the supplied voltage V with the voltage detector 34, and the supplied current I with the current detector 36, and they report the voltage and current to the CPU 38. From the detected V and I, the input energy W can be calculated by the CPU 38: V×I=W. The CPU 38 of the control station 20 includes a clock or timing circuit, allowing the CPU 38 to calculate the thermal load in joules J delivered to the heater of the cartridge 26, as the product of the input energy W over the length of time S for each soldering operation, as follows: W×S=J.

In addition, the soldering station may compute the input energy W, and average the input energy over a complete energization cycle to determine the average energy delivery for each pulse within an entire cycle. In practice, W is averaged according to the amount of energization in 21 pulses in one cycle. For example, if the amount of K pulses instead of 21 pulses, calculate the energy of 1 cycle as follows. K÷21×W×S=$J^P$. Here, S is 0.175 seconds if it is 60 Hz powered system.

The energy $J^i$ applied during an idling state when no soldering load is applied to the cartridge tip is calculated or measured and stored in the control station. The value of $J^i$ derived in advance for each type of soldering device is applied for each set temperature.

When a load is detected, the control system 20 calculates the soldering thermal load energy $J^s$ over the length of time $S^s$ that the soldering load is applied.

$$W \times S^s = J^s$$

From the energy $J^s$ under load and the energy $J^i$ at the idling state, the control system 20 can calculate the thermal load in joules $J^{tl}$ used in the soldering operation as: $J^s - J^i = J^{tl}$. This calculated $J^{tl}$ is the input energy to the load and may be set as the defined load cycle. The control system 20 calculates the energy for each cycle from the start to the end of the load condition. When the load state is terminated, the control station 20 has determined the energy $J^{tl}$ used for the soldering operation. This calculated $J^{tl}$ is the energy input to the load and can be the energy defined for using the cartridge and performing a proper soldering operation.

Figure 4:
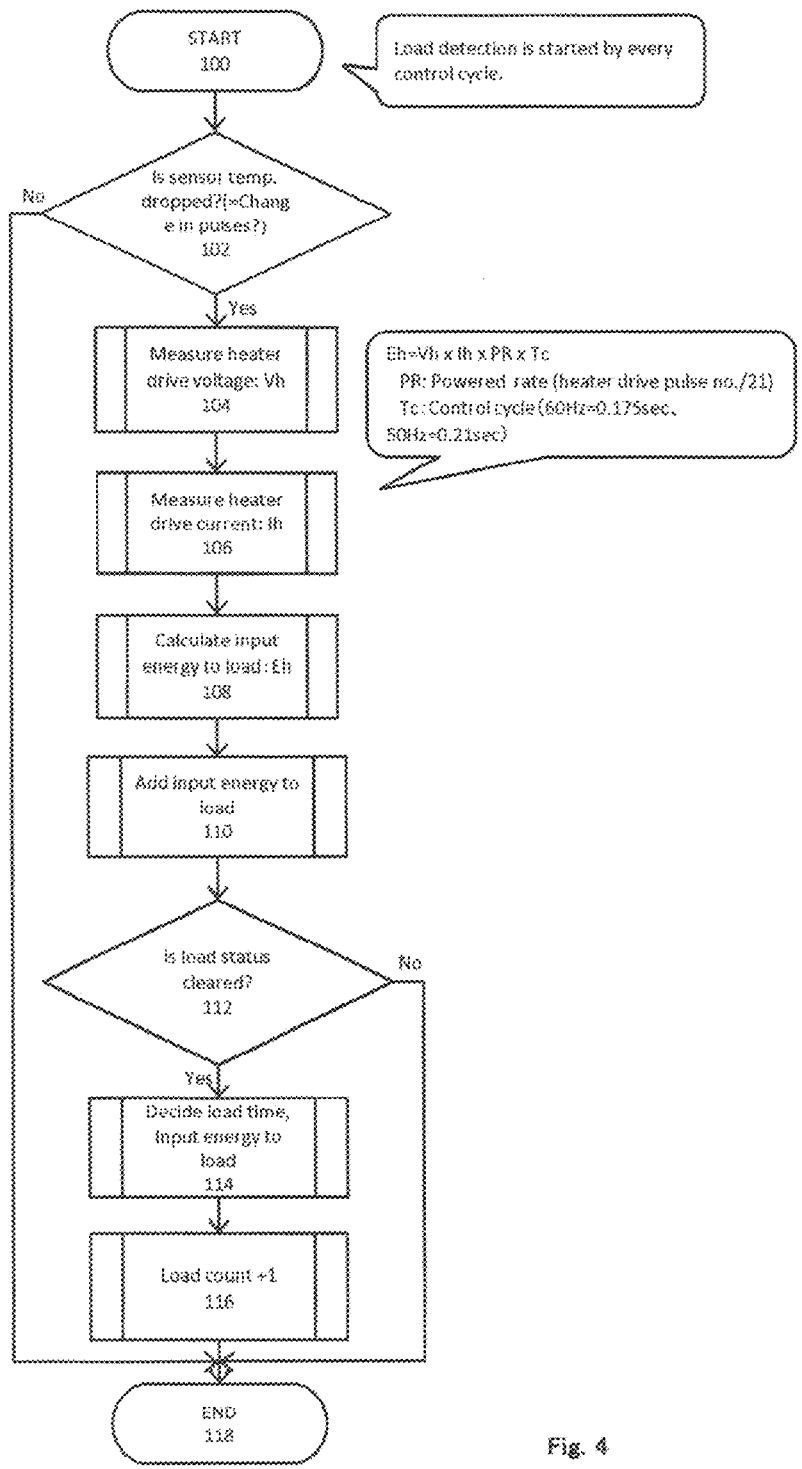
FIG. 4 is a program logic diagram for the software for the load detection function.

FIG. 4 provides a first program logic diagram for the software for a load detection function. The "Start" 100 of the load detection cycle is initiated with every control cycle, such that whenever the control station 20 is on and a cartridge is being powered, the load detection function is operational. At step 102, the determination is made as to whether the cartridge tip temperature sensor temperature has dropped. If yes, then at step 104 the control system measures the cartridge heater drive voltage V. At step 106, the control system 20 measures the cartridge heater drive current I. At step 108, the control system 20 calculates the required additional input energy requirement of the cartridge E. At step 110, the additional input energy E is delivered to the cartridge. At step 112, the control station 20 makes the determination as to whether the load has been removed or cleared, i.e. the soldering function has been completed. If at step 112 the determination is "yes," then the control system determines the total load time and the total input energy delivered to the cartridge for the soldering operation. Next, at step 116, the control systems 20 increments the memory field for the loads. After the completion of the cycle, the control system 20 continues to the end step 118. If the step 102 determination is "no", then the system proceeds to the end step 118. Also, when in step 112 the load status is not cleared, then the control system 20 continues to the end step 118.

FIGS. 5A and 5B depicts the steps for a basic program logic diagram for a user to be notified when a lower level energy input and an upper level energy input for a particular soldering event have been exceeded. The program initiates at the "start" step 120 when the control station 20 provides power to the soldering cartridge. At step 122, the program monitors the applied energy delivered to the cartridge, and the tip temperature from the temperature sensor of the cartridge, until the program determines that there has been a drop in the tip temperature. Upon determining that there has been a drop in the tip temperature, the program proceeds to decision step 124, where the program determines whether the tip temperature has dropped more than a predetermined amount, representing the beginning of a soldering event. If the determination is no, then the program returns to the beginning of step 122. If the determination is yes, then the program goes to step 126, where the program begins to calculate the energy input to the cartridge provided by the control station, which is a cumulative total energy in joules. The program then proceeds to decision step 128, where the program determines if the tip temperature has risen to the setting temperature. If the tip temperature has risen to the setting temperature, the program concludes that the soldering event has ended, and it advances to the end. However, if at step 128 the tip temperature has not risen to the set temperature, the program proceeds to step 130 to determine if the input energy for the soldering event has exceeded a first lower level user established value. If the lower level is not yet exceeded, the program returns to the beginning of step 130. When the lower level is exceeded, the program proceeds to step 132 and there the program causes the control station (or the soldering tool) to provide an indication that the lower level has been exceeded. For example, at step 132 the program may cause the control station to generate an audible beep, chime or tone. After step 132, the program proceeds to step 134 where it monitors the tip temperature to detect a temperature increase indicative of the end of a soldering procedure. If a tip temperature increase indicating the end of a soldering event is detected, the program advances to the end. If a tip temperature increase is not detected, the program proceeds to step 136, where the program determines if the input energy has exceeded a second, upper level. If the determination is no, the program returns to the beginning of step 136. If the determination is yes, then the program proceeds to step 138, and there the program causes the control station (or the soldering tool) to provide an indication that the upper level has been exceeded. For example, at step 138 the program may cause the control station to generate two audible beeps, chimes or tones, or an audible signal that is different from the audible signal for the lower level. After step 138, the program proceeds to a decision step 140 where the program monitors the tip temperature to detect a temperature increase indicative of the end of a soldering procedure, and waits for the soldering event to end, before advancing to the end step 142, after which the program effectively returns to start step 120.

The invention has been described in detail above in connection with the figures, however it should be understood that the system may include other components and enable other functions. For example, intercommunication of the data between control station 20, host machine 40, thermometer 80, and handle or cartridge in FIG. 1 can be either through hard-wired connections or wireless communication protocols. Those skilled in the art will appreciate that the foregoing disclosure is meant to be exemplary and specification and the figures are provided to explain the present invention, without intending to limit the potential modes of carrying out the present invention. The scope of the invention is defined only by the appended claims and equivalents thereto.

The invention claimed is:

1. A soldering system for use in soldering and de-soldering of electrical devices, the soldering system comprising:
    a control station including a central processing unit (CPU) and operations programs;
    a thermal tool assembly including a cable, a handle connected to said control station by said cable, and at least one cartridge removably installed in said handle and powered by said control station, said cartridge including a tip temperature sensor;
    a load detection circuit within said control station to detect an applied amount of energy during a soldering operation; and
    a program to monitor the load detection circuit and an amount of power delivered to said cartridge to identify the beginning and completion of each soldering operation based upon an energy load delivered by said control station to said cartridge said program further comprising:
    monitoring the applied amount of energy delivered by the soldering station to the thermal tool assembly;
    monitoring a tip temperature of the thermal tool assembly;
    determining that there has been a drop in the tip temperature in excess of a predetermined amount representing the beginning of the soldering operation;
    upon determining that the soldering operation has begun, calculating the energy input to the thermal tool assembly provided by the control station;
    determining when the input energy for the soldering operation exceeds a first lower level user established input energy level; and
    causing the control station to provide an indication that the lower level has been exceeded.

2. A soldering system for use in soldering and de-soldering of electrical devices, the soldering system comprising:
    a control station including a central processing unit (CPU) and operations programs wherein said CPU is programmed with a lower level energy input for a soldering operation, and said CPU causes said control station to generate an indication that the lower level energy input for the soldering operation has been delivered by the control station;
    a thermal tool assembly including a cable, a handle connected to said control station by said cable, and at least one cartridge removably installed in said handle and powered by said control station, said cartridge including a tip temperature sensor;
    a load detection circuit within said control station to detect an applied amount of energy during a soldering operation; and
    a program to monitor the load detection circuit and an amount of power delivered to said cartridge to identify the beginning and completion of each soldering operation based upon an energy load delivered by said control station to said cartridge.

3. The soldering system of claim 2, wherein said load detection circuit comprises: a voltage detector and a current detector to measure the voltage and current delivered by a power supply, said voltage detector and said current detector each being connected to and controlled by said CPU.

4. The soldering system of claim 2, wherein said CPU is programmed with an upper level energy input for the soldering operation, and said CPU causes said control station to generate an indication that the upper level energy input for the soldering operation has been delivered by the control station.

5. The soldering system of claim 2, wherein said operations program for controlling the operation of said control station further comprises:
    monitoring the applied energy delivered by the soldering station to a soldering device;
    monitoring the tip temperature of the soldering device;
    determining that there has been a drop in the tip temperature in excess of a predetermined amount representing the beginning of the soldering operation;
    upon determining that the soldering operation has begun, calculating the energy input to the soldering device provided by the control station;
    determining when the input energy for the soldering operation exceeds a first lower level user established input energy level; and
    causing the control station to provide an indication that the lower level has been exceeded.

6. A soldering system for use in soldering and de-soldering of electrical devices, the soldering system comprising:
    a control station including a central processing unit (CPU) and operations programs wherein said CPU of said control station is programmed with a lower level energy input for a soldering operation, and said CPU causes said control station to generate an indication that the lower level energy input for the soldering operation has been delivered by the control station and an upper level energy input for the soldering operation, and said CPU causes said control station to generate an indication that the upper level energy input for the soldering operation has been delivered by the control station;
    a thermal tool assembly including a cable, a handle connected to said control station by said cable, and at least one cartridge removably installed in said handle and powered by said control station, said cartridge including a tip temperature sensor;
    a load detection circuit within said control station to detect an applied amount of energy during a soldering operation; and
    a program to monitor the load detection circuit and an amount of power delivered to said cartridge to identify the beginning and completion of each soldering operation based upon an energy load delivered by said control station to said cartridge.

7. The soldering system of claim 6, wherein the operations program further comprises:
    monitoring the applied energy delivered by a soldering station to the thermal tool assembly;
    monitoring the tip temperature of the thermal tool;
    determining that there has been a drop in the tip temperature in excess of a predetermined amount representing the beginning of the soldering operation;
    upon determining that the soldering operation has begun, calculating the energy input to the thermal tool assembly provided by the control station;

determining when the input energy for the soldering operation exceeds a first lower level user established input energy level; and causing the control station to provide an indication that the lower level has been exceeded.

8. The operations program of claim 7, wherein the step of causing the control station to provide an indication further comprises causing the control station to generate an audible beep, chime or tone.

9. The operations program of claim 7, further comprising:

after the operations program determines that the input energy for the soldering operation exceeds a first lower level, the operations program monitors the tip temperature of the thermal tool assembly to detect a temperature increase indicative of the end of the soldering operation.

10. The operations program of claim 7, further comprising:

after the operations program determines that the input energy for the soldering event exceeds a first lower level, the operations program determines if the input energy has exceeded a second, upper level; and when the operations program determines that the second, upper level has been exceeded, the operations program causes the control station to provide an indication that the upper level has been exceeded.

11. A system for use in soldering and de-soldering of electrical devices, the system comprising:

a control station including a central processing unit (CPU) and operations programs, said control station further including a load detection circuit comprising a voltage detector and a current detector to measure a voltage and a current delivered by a power supply, said voltage detector and said current detector each being connected to and controlled by said CPU;

a thermal tool assembly for soldering or de-soldering operations, said thermal tool assembly including a tip temperature sensor that provides tip temperature data to said CPU; and an operation program loaded into said CPU to monitor said load detection circuit to identify when the rate at which energy delivered to energize the thermal tool increases, or if the frequency of an energization cycle increases to determine that a soldering load is being applied by said control station to said thermal tool, wherein said CPU is programmed with a lower level energy input for a soldering operation, and said CPU causes said control station to generate an indication that the lower level energy input for the soldering operation has been delivered by the control station.

12. The system of claim 11, further comprising an operation program loaded into said CPU to monitor said tip temperature sensor to identify the beginning and ending of the soldering operation.

13. The system of claim 11, wherein said control station further comprises a program to monitor the power delivered to said thermal tool to identify the completion of each soldering operation based upon the energy load provided to said thermal tool.

14. A system for use in soldering operations, the system comprising:

at least one control station including a central processing unit ("CPU") and associated circuitry, a display and control elements to allow a user to input control information to the control station;

said control station further including circuitry to receive a tip temperature signal from a soldering device, and circuitry to allow said control station to monitor and measure a voltage and a current delivered by said control station to a soldering device; and said CPU of said control station having a program to identify the beginning of a soldering operation, determine an amount of power delivered by the soldering station to a soldering device during the soldering operation, and identify when the soldering operation has been completed, wherein said CPU of said control station is programmed with a lower level energy input for a soldering operation, and said CPU causes said control station to generate an indication that the lower level energy input for the soldering operation has been delivered by the control station and an upper level energy input for the soldering operation, and said CPU causes said control station to generate an indication that the upper level energy input for the soldering operation has been delivered by the control station.

15. The system of claim 14, wherein said program to determine the power delivered to said cartridge identifies the completion of said soldering operation based upon a cumulative energy load delivered to the soldering device, said program further providing control of an alerting indicator to notify a user that said soldering operation has been completed.

16. The system of claim 14, wherein said circuitry to allow said control station to monitor and measure the voltage and current delivered by said control station to a soldering device further comprises:

a load detection circuit comprising a voltage detector and a current detector to measure the voltage and current delivered by said control station.

17. A method for controlling the operation of a soldering system that includes a soldering device and a controlled power supply for the soldering device, the method comprising:

monitoring an applied energy delivered to the soldering device by the power supply;

monitoring a tip temperature of the soldering device;

determining that there has been a drop in the tip temperature greater than a predetermined amount representing the beginning of a soldering event;

upon determining that a soldering event has begun, calculating an applied energy input to the soldering device provided by the power supply;

determining when the applied energy for the soldering event exceeds a first lower level user established applied energy level; and causing the soldering device to produce an indication that the first lower level has been exceeded.

18. The method of claim 17, further comprising:

after determining that the applied energy for the soldering event exceeds the first lower level, continuing to calculate the applied energy input to the soldering device provided by the power supply;

determining when the applied energy for the soldering event exceeds a second, upper level; and causing the soldering device to provide an indication that the second upper level has been exceeded.

* * * * *